(12) United States Patent
Jeon et al.

(10) Patent No.: US 11,056,036 B2
(45) Date of Patent: Jul. 6, 2021

(54) DISPLAY DEVICE AND DRIVING METHOD THEREOF

(71) Applicant: LG Display Co., Ltd., Seoul (KR)

(72) Inventors: Homin Jeon, Paju-si (KR); Seonggyun Kim, Paju-si (KR); Byoungchul Cho, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 20 days.

(21) Appl. No.: 16/101,037

(22) Filed: Aug. 10, 2018

(65) Prior Publication Data

US 2019/0051230 A1 Feb. 14, 2019

(30) Foreign Application Priority Data

Aug. 10, 2017 (KR) .................. 10-2017-0101895

(51) Int. Cl.
| | |
|---|---|
| G09G 3/20 | (2006.01) |
| H01L 27/32 | (2006.01) |
| G06F 1/16 | (2006.01) |
| G09G 3/3233 | (2016.01) |
| G09G 3/36 | (2006.01) |

(52) U.S. Cl.
CPC ......... *G09G 3/2003* (2013.01); *G06F 1/1652* (2013.01); *G09G 3/3233* (2013.01); *H01L 27/3211* (2013.01); *H01L 27/3213* (2013.01); *G09G 3/3607* (2013.01); *G09G 2300/0819* (2013.01); *G09G 2300/0842* (2013.01); *G09G 2310/08* (2013.01); *G09G 2320/028* (2013.01); *G09G 2320/0242* (2013.01); *G09G 2320/068* (2013.01); *G09G 2320/0666* (2013.01); *G09G 2354/00* (2013.01); *G09G 2360/16* (2013.01); *H01L 2251/5338* (2013.01)

(58) Field of Classification Search
None
See application file for complete search history.

(56) References Cited

U.S. PATENT DOCUMENTS

| | | | | |
|---|---|---|---|---|
| 6,535,225 B1* | 3/2003 | Shintaku | ............ | G09G 3/3611 |
| | | | | 345/690 |
| 2006/0175259 A1* | 8/2006 | Nurok | .................. | G01N 30/90 |
| | | | | 210/656 |
| 2006/0176259 A1* | 8/2006 | Yamada | .............. | G09G 3/3607 |
| | | | | 345/88 |
| 2011/0267541 A1* | 11/2011 | Hirokane | ................ | G09G 3/36 |
| | | | | 348/671 |
| 2014/0118255 A1* | 5/2014 | Billerbeck | ............ | G06F 3/017 |
| | | | | 345/158 |
| 2014/0363126 A1* | 12/2014 | Kat | ........................ | G01B 11/18 |
| | | | | 385/37 |

(Continued)

FOREIGN PATENT DOCUMENTS

| | | |
|---|---|---|
| CN | 1682271 A | 10/2005 |
| CN | 105405394 A | 3/2016 |
| WO | 2004/027746 A1 | 4/2004 |

*Primary Examiner* — Christopher R Lamb
(74) *Attorney, Agent, or Firm* — Seed IP Law Group LLP

(57) ABSTRACT

A display device and driving method thereof are provided. The display device comprises a display panel and a color compensation part. The display panel comprises a display area which has a flat portion and a bending portion. The color compensation part compensates for input data signals by applying data gains which are set differently for the flat portion and the bending portion.

17 Claims, 12 Drawing Sheets

(56) References Cited

U.S. PATENT DOCUMENTS

| 2016/0196778 A1* | 7/2016 | Cha | G09G 3/20 |
| | | | 345/694 |
| 2016/0196779 A1* | 7/2016 | Park | G09G 3/3648 |
| | | | 345/690 |
| 2016/0205391 A1* | 7/2016 | Kim | G09G 3/3225 |
| | | | 348/51 |

* cited by examiner

Fig. 7
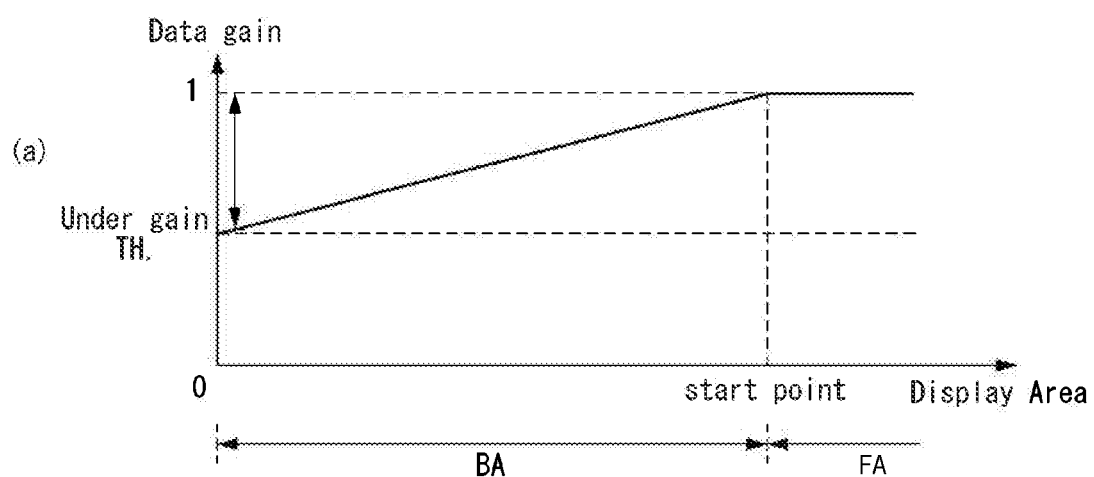
(a)
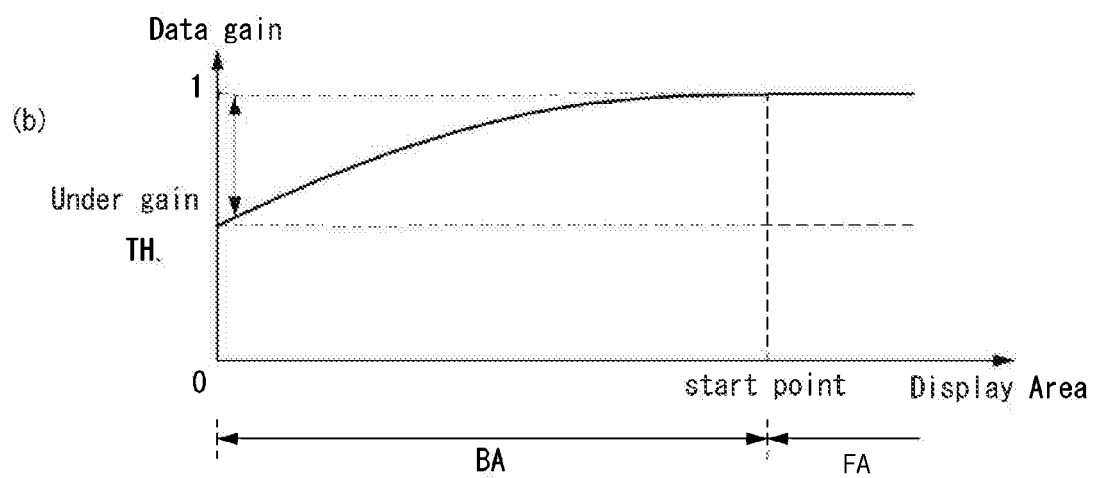
(b)

Fig. 14
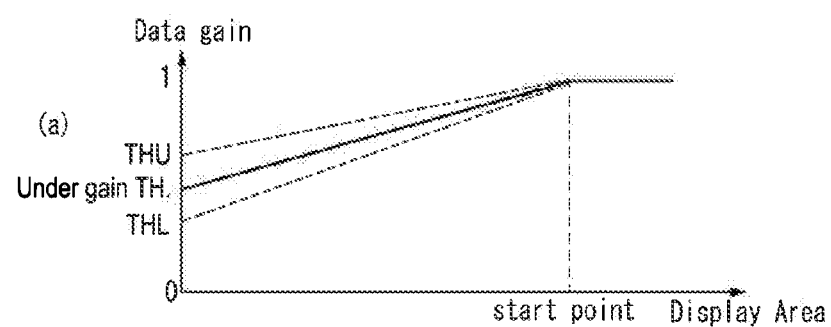
(a)
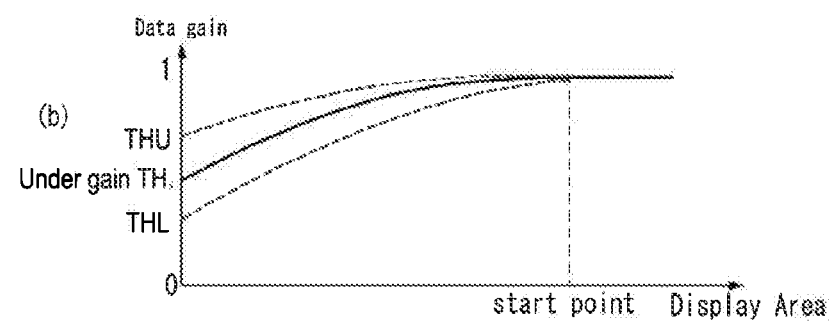
(b)

DISPLAY DEVICE AND DRIVING METHOD THEREOF

This application claims the benefit of Korean Patent Application No. 10-2017-0101895, filed on Aug. 10, 2017, which is incorporated herein by reference for all purposes as if fully set forth herein.

BACKGROUND

Technical Field

The present disclosure relates to a display device and a driving method thereof.

Description of the Related Art

The market for displays which act as an intermediary between users and information is growing with the development of information technology. Thus, different types of display devices such as organic light-emitting displays (OLED), liquid crystal displays (LCD), and quantum dot displays (PDP) are increasingly used.

A display device can display images by subpixels that work in response to scan signals and data signals applied to a display panel. To this end, the display device comprises a display panel comprising a plurality of subpixels, a scan driver supplying scan signals (or gate signals) to the display panel, a data driver supplying data signals to the display panel, and a power supply part supplying electric power to the display panel and the drivers.

Some display devices may have a bent or curved display panel because of their flexibility. Display devices with a flexible display panel have various purposes, so there is ongoing research on them. However, in conventionally proposed methods, there is a need for improvement in color deviations between a display area of a bending portion and a display area of a flat portion.

BRIEF SUMMARY

The present disclosure provides a display device comprising a display panel and a color compensation part. The display panel comprises a display area which has a flat portion and a bending portion. The color compensation part compensates for input data signals by applying data gains which are set differently for the flat portion and the bending portion.

In another aspect, the present disclosure provides a method of driving a display device with a display panel, wherein the display panel comprises a display area which has a flat portion and a bending portion, the method comprising: calculating a viewing angle at which a user is looking at the display panel; calculating a slope angle of the display panel; deriving a gain curve for the bending portion based on the viewing angle and the slope angle; calculating data gains for the bending portion based on the gain curve; and correcting input data signals by applying the calculated data gains.

BRIEF DESCRIPTION OF THE SEVERAL VIEWS OF THE DRAWINGS

The accompany drawings, which are included to provide a further understanding of the disclosure and are incorporated on and constitute a part of this specification illustrate embodiments of the disclosure and together with the description serve to explain the principles of the disclosure;

FIG. 7 is a graph illustrating the concept of compensation according to a first exemplary embodiment of the present disclosure;

FIG. 14 is a graph illustrating the concept of compensation according to a third exemplary embodiment of the present disclosure.

DETAILED DESCRIPTION

Reference will now be made in detail to embodiments of the disclosure examples of which are illustrated in the accompanying drawings.

Hereinafter, concrete embodiments of the present disclosure will be described with reference to the accompanying drawings.

A display device to be described below may be implemented as a television, a video player, a personal computer (PC), a home theater, a smartphone, a virtual reality (VR) device, etc. Also, an organic light-emitting display based on an organic light-emitting diode (light-emitting element) will be taken as an example of the display device to be described below. Alternatively, the display device to be described below may be implemented based on an inorganic light-emitting diode.

Lastly, the terms "source electrode" and "drain electrode" of thin-film transistors of the organic light-emitting display to be described below may be used interchangeably for different types of transistors, but the term "gate electrode" is fixed for different types of transistors. Hence, the source and drain electrodes may be termed first and second electrodes so as not to limit them.

Figure 1:
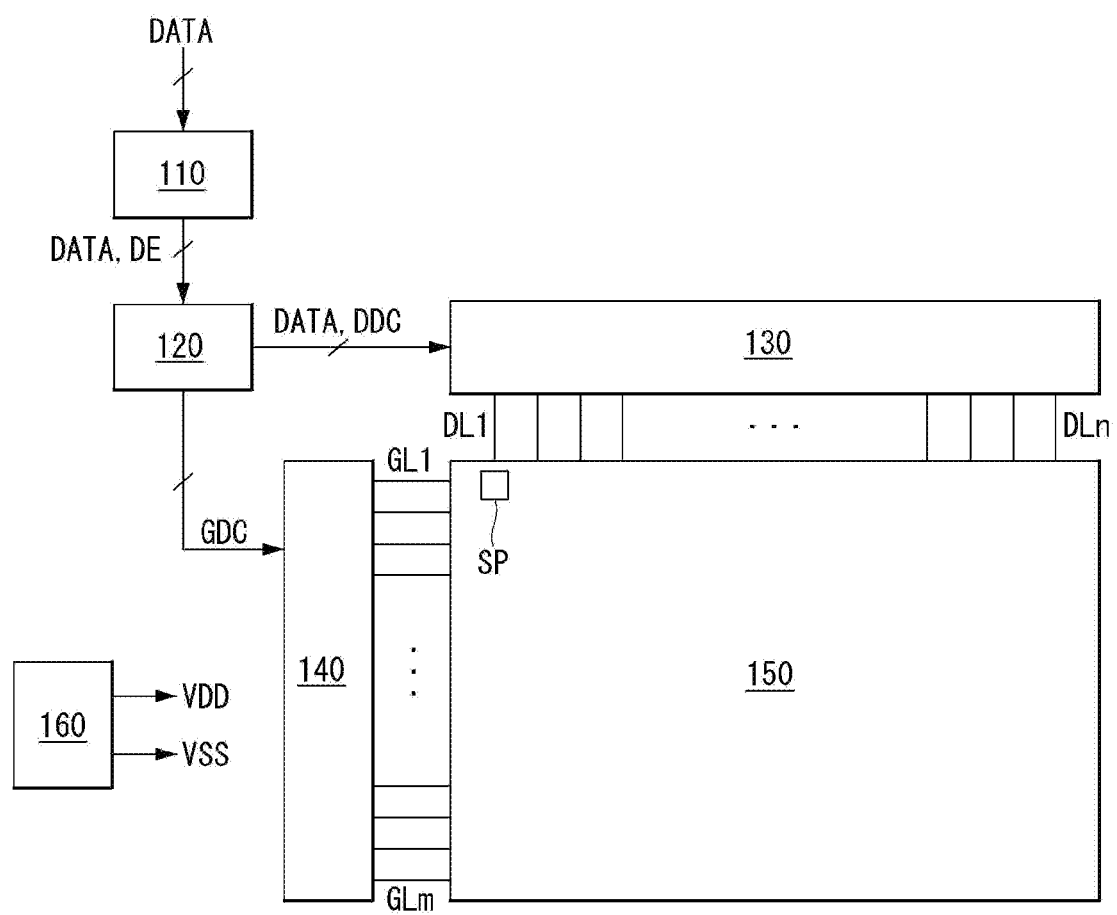
FIG. 1 is a schematic block diagram of an organic light-emitting display.
Figure 2:
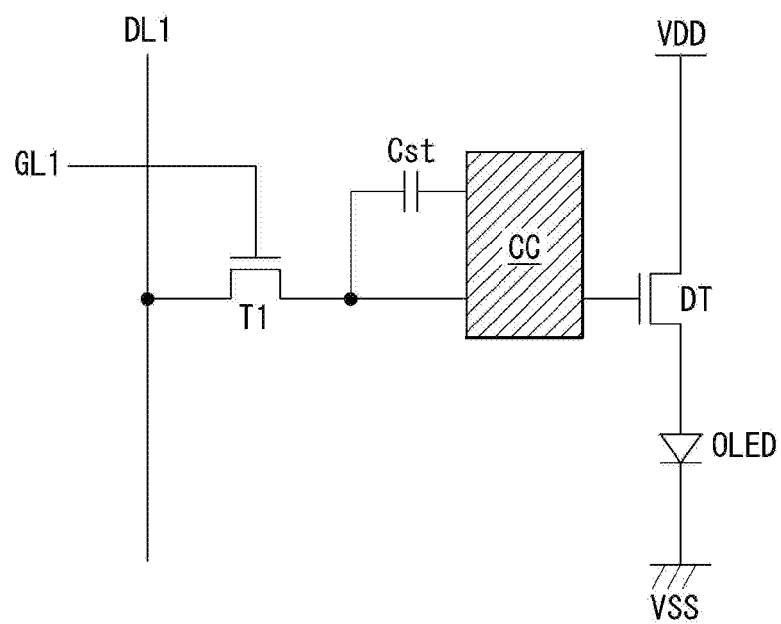
FIG. 2 is a schematic circuit diagram of a subpixel.
Figure 3:
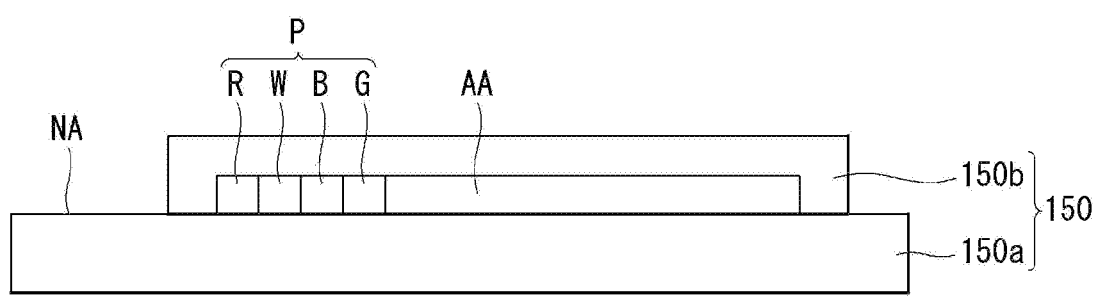
FIG. 3 is an illustration of a cross-section of a display panel.
Figure 4:
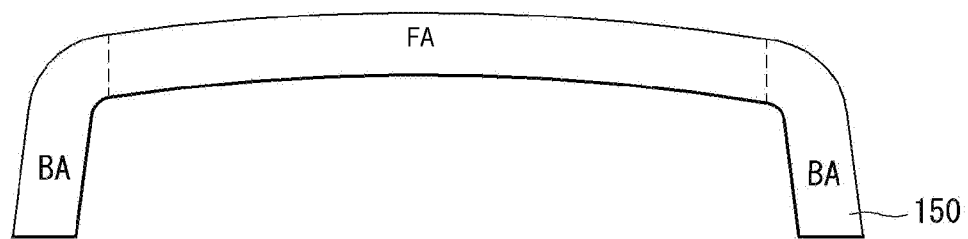
FIG. 4 is a view showing a display panel with a curve.

FIG. 1 is a schematic block diagram of an organic light-emitting display. FIG. 2 is a schematic circuit diagram of a subpixel. FIG. 3 is an illustration of a cross-section of a display panel. FIG. 4 is a view showing a display panel with a curved surface.

As shown in FIG. 1, the organic light-emitting display comprises an image processor 110, a timing controller 120, a data driver 130, a scan driver 140, a display panel 150, and a power supply part 160.

The image processor 110 outputs a data enable signal DE, along with externally supplied data signals DATA. The image processor 110 may output one or more among a vertical synchronization signal, a horizontal synchronization signal, and a clock signal, in addition to the data enable signal DE. These signals may be omitted in the drawings for convenience of explanation.

The timing controller 120 receives data signals DATA, along with a data enable signal DE and drive signals comprising one or more of a vertical synchronization signal, a horizontal synchronization signal, and a clock signal, from the image processor 110. The timing controller 120 outputs a gate timing control signal GDC for controlling the operation timing of the scan driver 140 and a data timing control signal DDC for controlling the operation timing of the data driver 130, based on the drive signals.

The data driver 130 samples and latches a data signal DATA supplied from the timing controller 120 in response to a data timing control signal DDC supplied from the timing controller 120, and converts it into a gamma reference voltage. The data driver 130 outputs data signals DATA through data lines DL1 to DLn. The data driver 130 may be provided in the form of an IC (integrated circuit).

The scan driver 140 outputs scan signals in response to a gate timing control signal GDC supplied from the timing controller 120. The scan driver 140 outputs scan signals through scan lines GL1 to GLm. The scan driver 140 may be provided in the form of an IC (integrated circuit) or formed on the display panel 150 using the gate-in-panel technology.

The power supply part 160 outputs a high-level voltage and a low-level voltage. The high-level voltage and low-level voltage outputted from the power supply part 160 are supplied to the display panel 150. The high-level voltage is supplied to the display panel 150 via a first power line EVDD, and the low-level voltage is supplied to the display panel 150 via a second power line EVSS.

The display panel 150 displays an image in response to data signals DATA and scan signals respectively supplied from the data driver 130 and scan driver 140 and power supplied from the power supply part 160. The display panel 150 comprises a first substrate, with subpixels SP formed on the first substrate that work to display an image, and a second substrate that seals the subpixels SP along with the first substrate. The first substrate and the second substrate may be made of rigid material such as glass or flexible material such as resin.

The subpixels SP may comprise red subpixels, green subpixels, and blue subpixels, or may comprise white subpixels, red subpixels, green subpixels, and blue subpixels. The subpixels SP may have one or more different light-emission areas depending on the light-emission characteristics.

As shown in FIG. 2, a single subpixel comprises a switching transistor T1, a driving transistor DT, a capacitor Cst, and an organic light-emitting diode OLED. A single subpixel may further comprise a pixel compensation circuit CC.

The switching transistor T1 switches to store a data voltage supplied via the first data line DL1 as a data voltage in the capacitor Cst, in response to a scan signal supplied via the first scan line GL1. The driving transistor DT works in such a way that a drive current flows between the first power line EVDD (high-level voltage) and the second power line EVSS (low-level voltage) in response to the data voltage stored in the capacitor Cst. The organic light-emitting diode OLED works in such a way as to emit light in response to the drive current formed by the driving transistor DT.

The pixel compensation circuit CC is a circuit that is added into the subpixel to compensate for the threshold voltage, etc., of the driving transistor DT. The pixel compensation circuit CC consists of one or more transistors. The pixel compensation circuit CC may have many configurations depending on the method of compensation, so a description thereof will be omitted.

As shown in FIG. 3, the display panel 150 comprises a substrate (or thin-film transistor substrate) 150a having a display area AA and a non-display area NA and a protective film (or protective substrate) 150b. In the display area AA, pixels P are formed based on the circuit illustrated in FIG. 2. The substrate 150a and the protective film 150b are made of flexible material.

The pixels P arranged in the display area AA comprise subpixels of red (R), white (W), blue (B), and green (G). The subpixels of red (R), white (W), blue (B), and green (G) are arranged horizontally or vertically on the substrate 150a. However, the sequence in which the aforementioned subpixels are arranged may vary with light-emitting material, light-emission area, and the configuration (or structure) of the pixel compensation circuit. Also, red (R), blue (B), and green (G) subpixels may constitute a single pixel P.

As shown in FIG. 4, some region of the display panel 150 may be curved because of their flexibility. The display panel 150 with a curved surface comprises a display area FA of a flat portion and a display area BA of a bending portion. The shape of the display panel 150 with a curved surface is not limited to what is shown in FIG. 4.

Problems with a conventionally proposed method will be described below.

Figure 5:
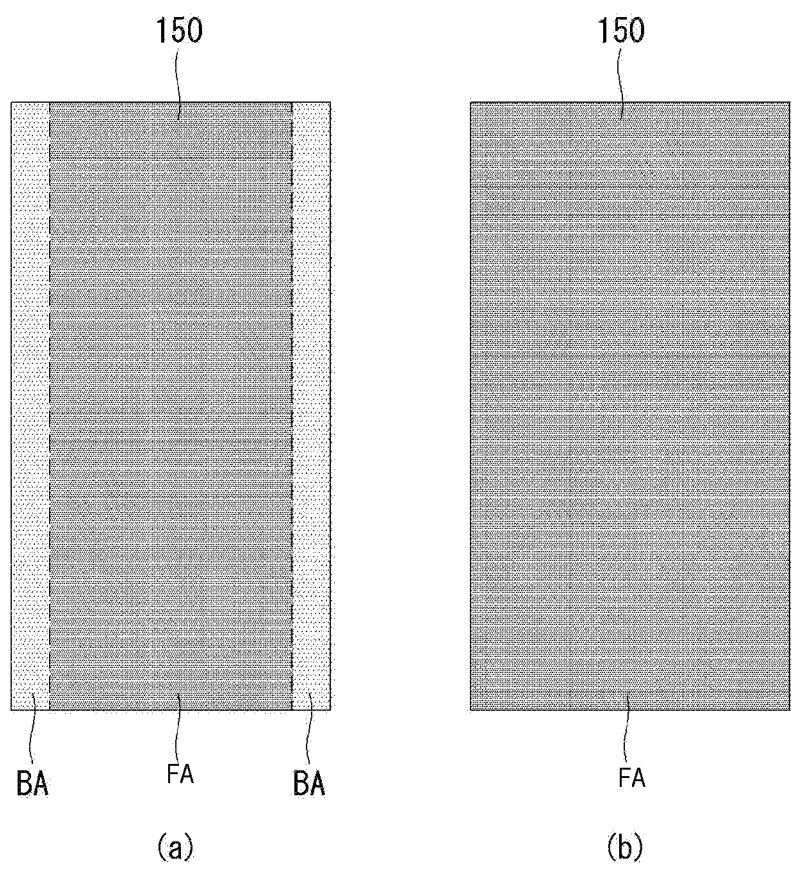
FIGS. 5 and 6 are views illustrating a color deviation problem with a conventionally proposed display panel with a curve.
Figure 6:
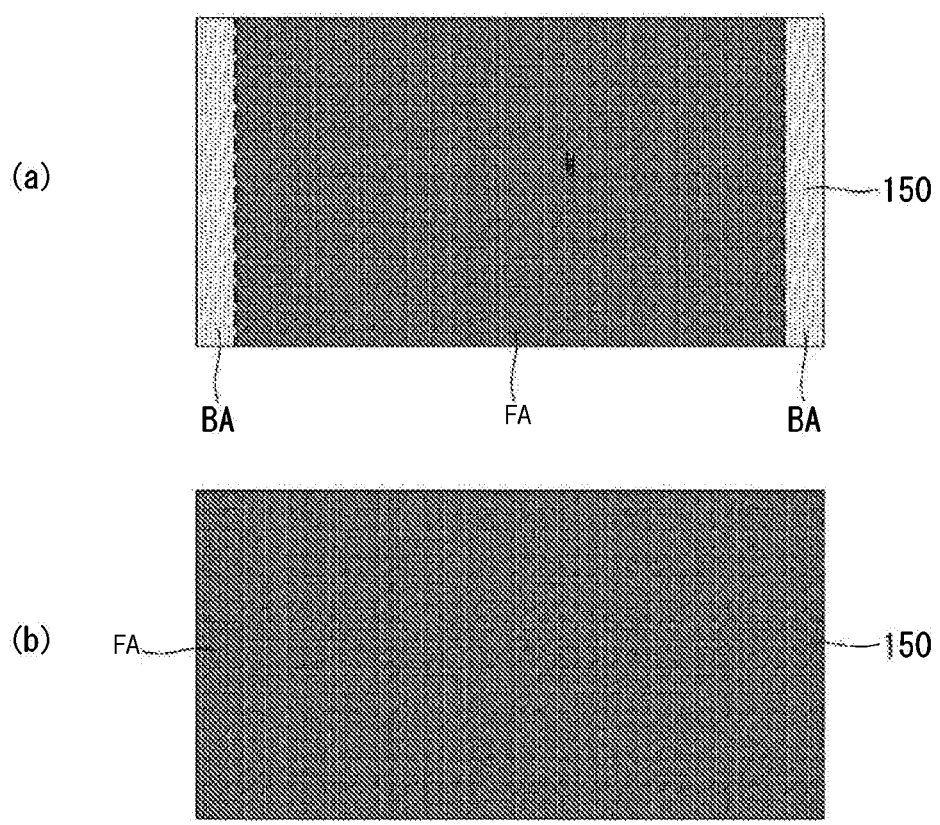

FIGS. 5 and 6 are views illustrating a color deviation problem with a conventionally proposed display panel with a curved surface.

(a) of FIG. 5 shows a curved surface along the long axis of a display panel 150, and (b) of FIG. 5 shows a typical display panel 150 with a flat display area FA with no curve. (a) of FIG. 6 shows a curved surface along the short axis of a display panel 150, and (b) of FIG. 6 shows a typical display panel 150 with a flat display area FA with no curve.

As can be seen from FIGS. 5 and 6, when an image is displayed on a display panel 150 comprising a display area FA of a flat portion and a display area BA of a bending portion, there is a color deviation between the two areas due to the curves. On the contrary, a typical display panel 150 displays an image with uniform colors represented across all areas since it only has the flat display area FA.

Display devices with a flexible display panel have various purposes, so there is ongoing research on them. However, in conventionally proposed methods, there is no improvement in color deviations between the display area BA of the bending portion and the display area FA of the flat portion.

Figure 8:
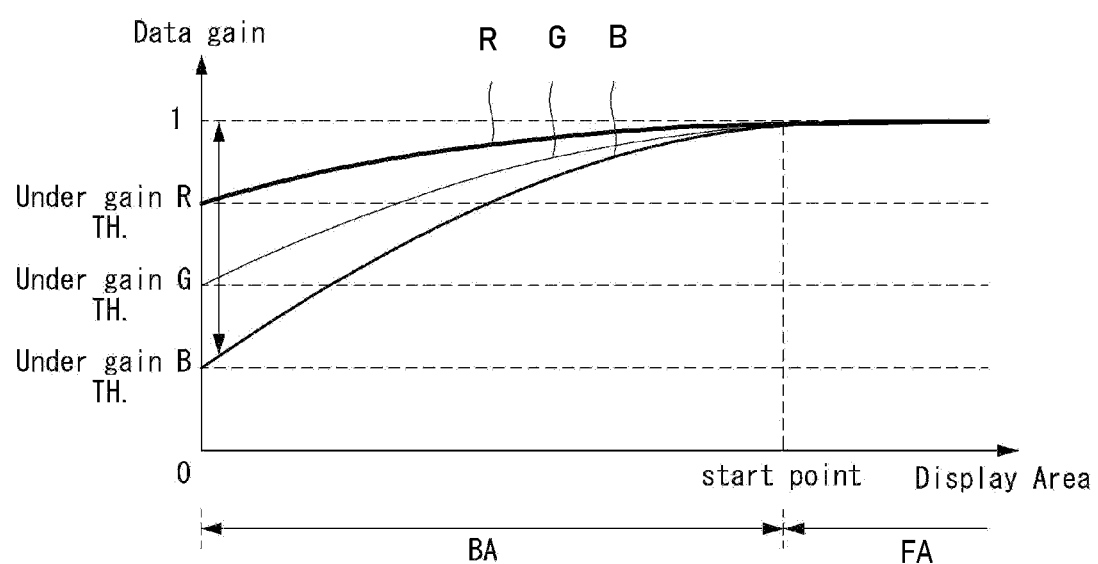
FIG. 8 is a graph illustrating the concept of compensation by color according to the first exemplary embodiment of the present disclosure.
Figure 9:
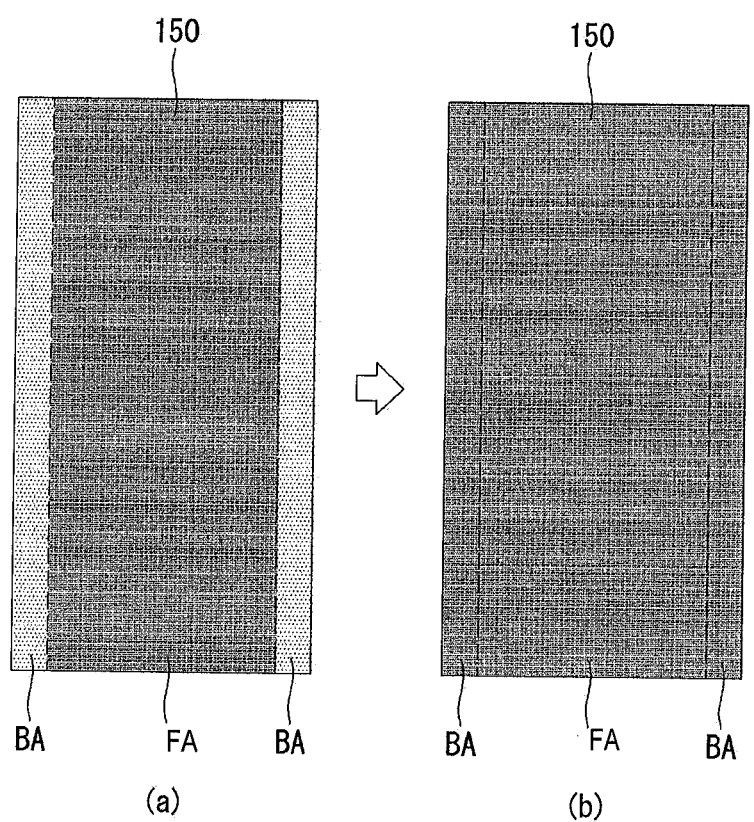
FIG. 9 is a view illustrating a comparison of before and after a compensation.
Figure 10:
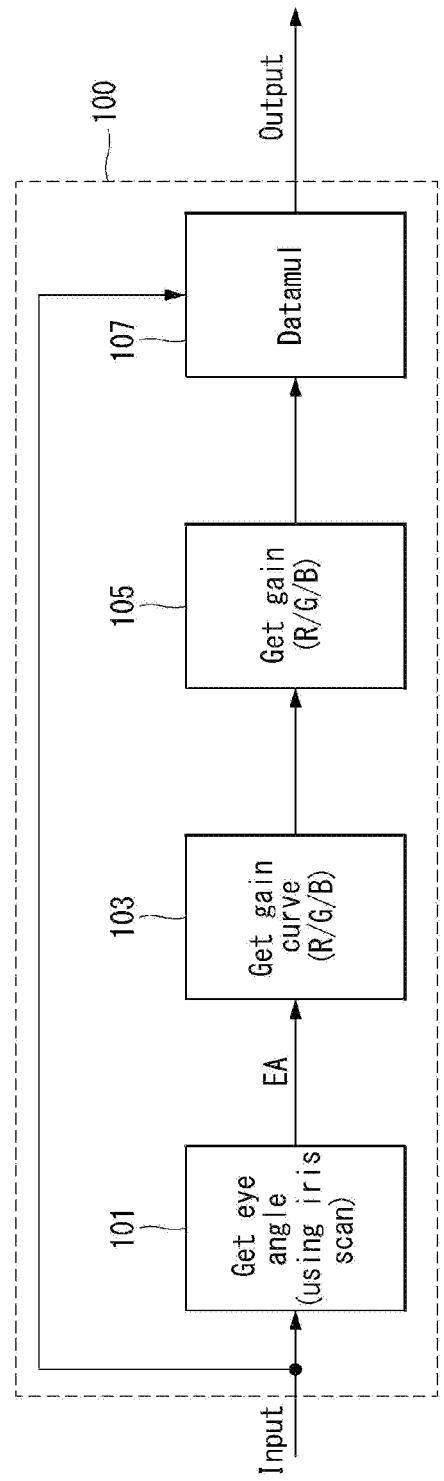
FIG. 10 is an illustration of components of a color compensation part according to the first exemplary embodiment of the present disclosure.
Figure 11:
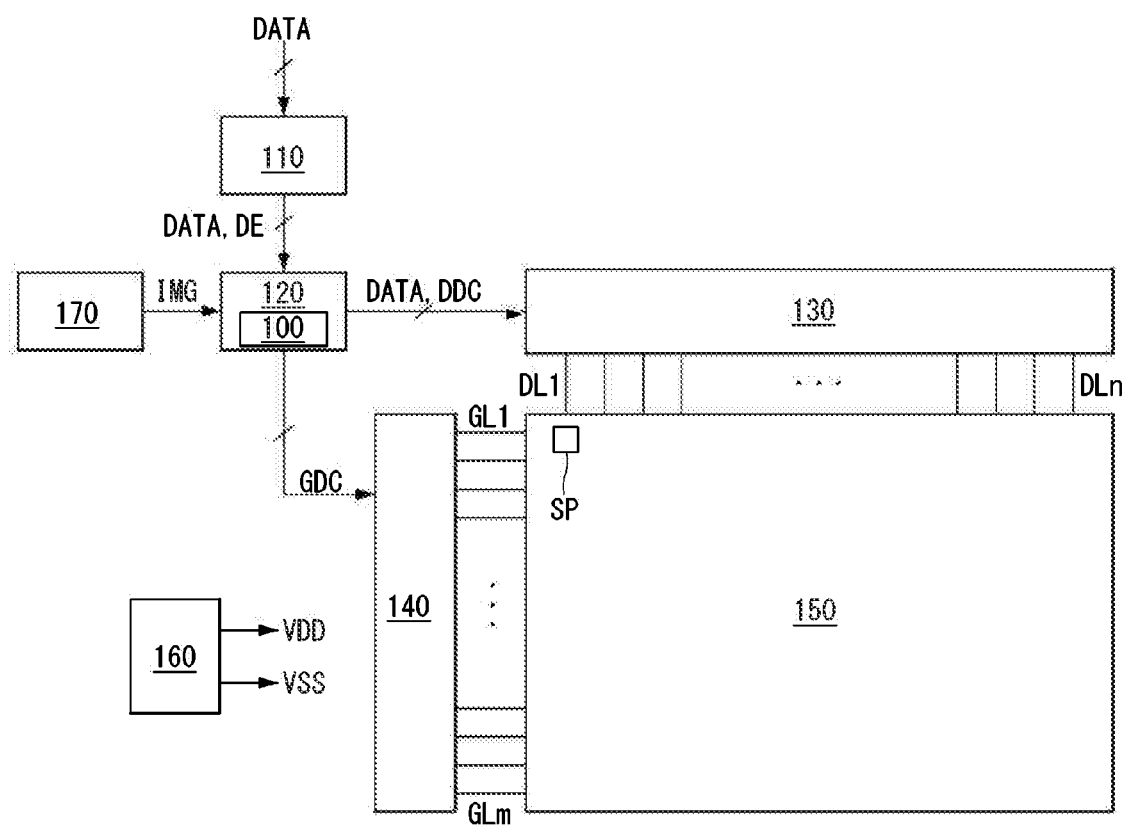
FIG. 11 is a schematic block diagram of a display device with a color compensation part according to the first exemplary embodiment of the present disclosure.

FIG. 7 is a graph illustrating the concept of compensation according to a first exemplary embodiment of the present disclosure. FIG. 8 is a graph illustrating the concept of compensation by color according to the first exemplary embodiment of the present disclosure. FIG. 9 is a view illustrating a comparison of before and after a compensation. FIG. 10 is an illustration of components of a color compensation part according to the first exemplary embodiment of the present disclosure. FIG. 11 is a schematic block diagram of a display device with a color compensation part according to the first exemplary embodiment of the present disclosure.

In FIG. 7, the vertical axis represents data gain, and the horizontal axis represents position on the display area. The display area of a display panel comprises a display area BA of a bending portion and a display area FA of a flat portion. The display area BA of the bending portion and the display area FA of the flat portion are separated by a start point.

In an example, the start point corresponds to the boundary between the display area BA of the bending portion and the display area FA of the flat portion. In another example, the start point corresponds to the point at which the display area on the display panel starts bending. In an example, the start point corresponds to a point at which data gain starts to vary. Therefore, the start point in FIG. 7 may be construed as having any one or more of three meanings: "start point", "boundary", and/or "point of variation".

As shown in FIG. 7, in the first exemplary embodiment of the present disclosure, data gain for data signals varies depending on whether the data signals are generated (or compensated) for the display area BA of the bending portion or the display area FA of the flat portion.

As in a first example shown in (a) of FIG. 7, the data gain for the display area BA of the bending portion may vary linearly from threshold gain Under gain TH.

The threshold gain Under gain TH is set with respect to the outermost part of the display area BA of the bending portion. The data gain varies linearly from the threshold gain Under gain TH for the outermost part of the display area BA of the bending portion to the start point.

Although the data gain may vary for each display area as described above, it converges to values with which the display area BA of the bending portion and the display area FA of the flat portion are similar or identical without color deviations and color temperature differences.

As in a second example shown in (b) of FIG. 7, the data gain for the display area BA of the bending portion may vary nonlinearly (quadratically) from the threshold gain Under gain TH. The threshold gain Under gain TH is obtained through a test conducted to even out either or both of color deviations and color temperature differences.

The threshold gain Under gain TH is set with respect to the outermost part of the display area BA of the bending portion. The data gain varies nonlinearly (e.g., quadratically) from the outermost part of the display area BA of the bending portion to the start point.

Meanwhile, FIG. 7 shows an example in which the threshold gain Under gain TH is set to a median value between 0 and 1. However, the threshold gain Under gain TH is obtained through a test conducted to even out either or both of color deviations and color temperature differences, and may therefore vary with the bending degree of the display panel, intrinsic color difference information, GPU, etc.

As shown in FIG. 8, the display panel is implemented by pixels comprising red, green, and blue subpixels. Thus, red, green, and blue data signals are input to the display area BA of the bending portion, and the data gains may vary in accordance to the gain curve R of a red data signal, the gain curve G of a green data signal, and the gain curve B of a blue data signal.

Moreover, FIG. 8 shows an example in which the data gain has the lowest to highest reference values in the order: the threshold gain Under gain B TH of the blue data signal, the threshold gain Under gain G TH of the green data signal, and the threshold gain Under gain R TH of the red data signal. However, the threshold gain Under gain TH may vary with color differences on the display panel caused by the different data signals.

That is, in the first exemplary embodiment of the present disclosure, different gains are used for red, green, and blue data signals so that the data gain varies with color differences on the display panel, thereby compensating for color temperature differences as well as color deviations.

By varying the data gain for each area according to the first exemplary embodiment, the color difference shown in (a) of FIG. 9 is eliminated or improved as shown in (b) of FIG. 9. As a consequence, the display area BA of the bending portion and the display area FA of the flat portion may represent similar or identical colors. Below is a description of a device configuration for carrying out the first exemplary embodiment.

As shown in FIGS. 7 to 10, the display device according to the first exemplary embodiment of the present disclosure comprises a color compensation part 100 varies data gain for the display area of the bending portion and the display area of the flat portion. The color compensation part 100 comprises a viewing angle calculator 101, a gain curve derivation part 103, a gain calculator 105, and an output data correction part 107.

The viewing angle calculator 101 serves to calculate the viewing angle at which the user is looking at the display panel (the angle at which the display panel is viewed; hereinafter, "viewing angle information"). The viewing angle calculator 101 may calculate viewing angle information EA by receiving collected image information from a camera or the like and analyzing it. For instance, the viewing angle calculator 101 may calculate viewing angle information EA through iris scanning. Also, the camera may collect image information through, but not limited to, eye tracking.

The gain curve derivation part 103 serves to derive compensated gain curves suitable for the display area BA of the bending portion on the display panel, based on the viewing angle information EA sent from the viewing angle calculator 101. That is, the gain curve derivation part 103 serves to derive compensated gain curves suitable for eliminating or improving color deviations in the display area BA of the bending portion on the display panel by referring to changes in the viewing angle at which the user is looking at the display panel.

The gain curve derivation part 103 derives compensated gain curves suitable for the display area BA of the bending portion on the display panel by using the gain curve system shown in (a) of FIG. 7 or the gain curve system shown in (b) of FIG. 7. The gain curve derivation part 103 derives compensated gain curves (like those shown in FIG. 8) to use for red, green, and blue signals, individually. The compensated gain curves derived by the gain curve derivation part 103 are used only for data gain compensation. Therefore, a compensated gain, as well as a threshold gain or compensation range, may be set in the gain curve derivation part 103.

The gain calculator 105 serves to calculate final data gains to use for the display area BA of the bending portion, based on the compensated gain curves sent from the gain curve derivation part 103. The compensated gain curves sent from the gain curve derivation part 103 comprise gain curves for red, green, and blue data signals. Therefore, the gain calculator 105 calculates final data gains for the red, green, and blue data signals, individually.

The data correction part 107 serves to correct final output data signals by arithmetically processing the final data gains sent from the gain calculator 105 and external input data signals. The correction by the data correction part 107 allows the display area BA of the bending portion and the display area FA of the flat portion, which are on the display panel, to receive data signals that can represent similar/identical colors. The data correction part 107 may correct data signals for each pixel or for each pixel block consisting of a plurality of pixels, in order to compensate for the display area BA of the bending portion on the display panel.

As shown in FIG. 11, the color compensation part 100 may be included within the timing controller 120. In this case, the timing controller 120 calculates the user's viewing angle information by receiving image information IMG from a camera 170 and analyzing it. The timing controller 120 then determines data gains based on the viewing angle information and corrects data signals with the data gains to supply to the display area of the bending portion on the display panel 150.

As above, the timing controller 120 may perform all functions of the color compensation part 100, correct data signals inputted from the image processor 110, and output corrected data signals. However, this is merely an example, and the color compensation part 100 may be included within the image processor 110. Moreover, one or more of the components of the color compensation part 100 may be included in other devices.

<Second Exemplary Embodiment>

Figure 12:
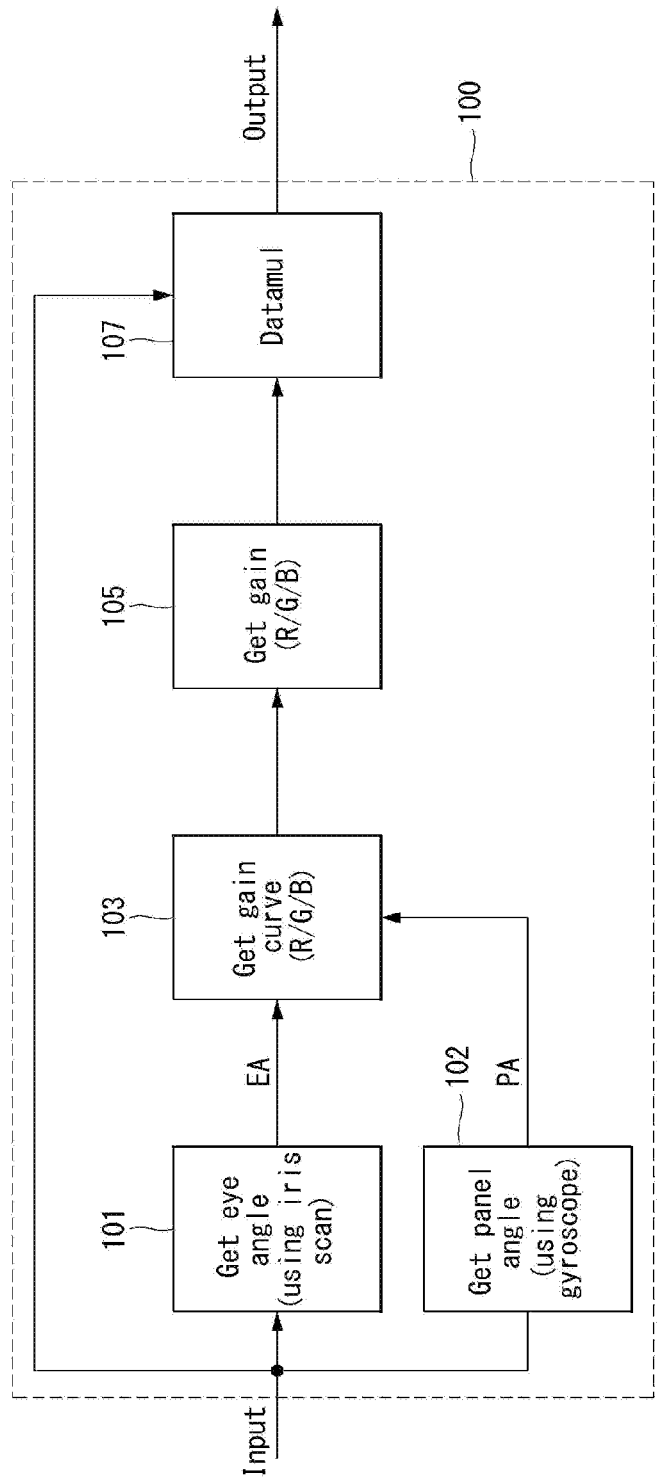
FIG. 12 is an illustration of components of a color compensation part according to a second exemplary embodiment of the present disclosure.
Figure 13:
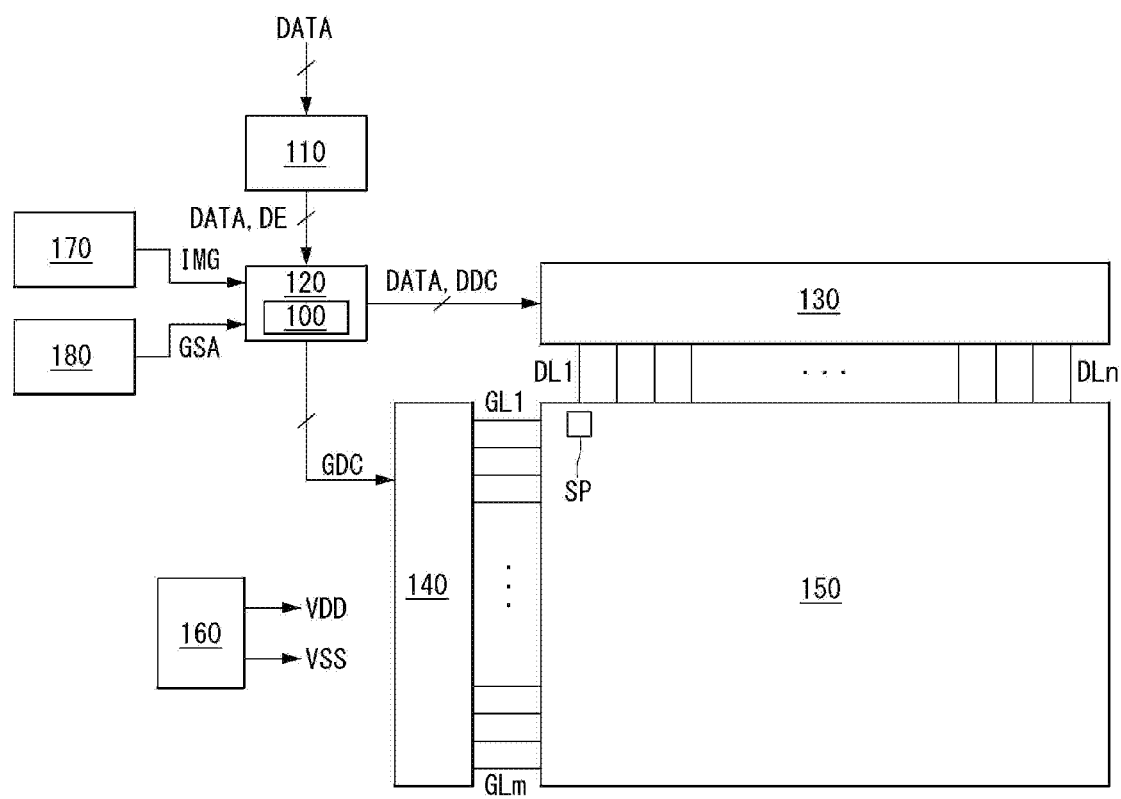
FIG. 13 is a schematic block diagram of a display device with a color compensation part according to the second exemplary embodiment of the present disclosure.

FIG. 12 is an illustration of components of a color compensation part according to a second exemplary embodiment of the present disclosure. FIG. 13 is a schematic block diagram of a display device with a color compensation part according to the second exemplary embodiment of the present disclosure.

As shown in FIGS. 7, 8, and 12, the display device according to the second exemplary embodiment of the present disclosure comprises a color compensation part 100 varies data gain for the display area of the bending portion and the display area of the flat portion. The color compensation part 100 comprises a viewing angle calculator 101, a panel angle calculator 102, a gain curve derivation part 103, a gain calculator 105, and an output data correction part 107.

The viewing angle calculator 101 serves to calculate the viewing angle when the user is looking at the display panel (the angle at which the display panel is viewed; hereinafter, "viewing angle information"). The viewing angle calculator 101 may calculate viewing angle information EA by receiving collected image information from a camera or the like and analyzing it. For instance, the viewing angle calculator 101 may calculate viewing angle information EA through iris scanning. Also, the camera may collect image information through, but not limited to, eye tracking.

The panel angle calculator 102 serves to calculate the slope angle of the display panel. The panel angle calculator 102 may calculate panel angle information PA by receiving a slope value (or slope information) from a slope/motion sensor (e.g., gyroscope) and analyzing it.

The gain curve derivation part 103 serves to derive compensated gain curves suitable for the display area BA of the bending portion on the display panel, based on the viewing angle information EA sent from the viewing angle calculator 101 and the panel angle information PA sent from the panel angle calculator 102. That is, the gain curve derivation part 103 serves to derive compensated gain curves suitable for eliminating or improving color deviations in the display area BA of the bending portion on the display panel by referring to changes in the viewing angle at which the user is looking at the display panel and changes in the slope of the display panel.

The gain curve derivation part 103 derives compensated gain curves suitable for the display area BA of the bending portion on the display panel by using the gain curve system shown in (a) of FIG. 7 or the gain curve system shown in (b) of FIG. 7. The gain curve derivation part 103 derives compensated gain curves (like those shown in FIG. 8) to use for red, green, and blue signals, individually. The compensated gain curves derived by the gain curve derivation part 103 are used only for data gain compensation. Therefore, a compensated gain, as well as a threshold gain or compensation range, may be set in the gain curve derivation part 103.

The gain calculator 105 serves to calculate final data gains to use for the display area BA of the bending portion, based on the compensated gain curves sent from the gain curve derivation part 103. The compensated gain curves sent from the gain curve derivation part 103 comprise gain curves for red, green, and blue data signals. Therefore, the gain calculator 105 calculates final data gains for the red, green, and blue data signals, individually.

The data correction part 107 serves to correct final output data signals by arithmetically processing the final data gains sent from the gain calculator 105 and external input data signals. The correction by the data correction part 107 allows the display area BA of the bending portion and the display area FA of the flat portion, which are on the display panel, to receive data signals that can represent similar/identical colors. The data correction part 107 may correct data signals for each pixel or for each pixel block consisting of a plurality of pixels, in order to compensate for the display area BA of the bending portion on the display panel.

As shown in FIG. 13, the color compensation part 100 may be included within the timing controller 120. In this case, the timing controller 120 calculates the user's viewing angle information EA by receiving image information IMG from the camera 170 and analyzing it. Also, the timing controller 120 calculates the panel angle information PA by receiving slope information GSA from a gyroscope 180 and analyzing it. The timing controller 120 then determines data gains based on the viewing angle information EA and the panel angle information PA and corrects data signals with the data gains to supply to the display area of the bending portion on the display panel 150 based on the information IMG and GSA sent from the camera 170 and the gyroscope 180.

As above, the timing controller 120 may perform all functions of the color compensation part 100, correct data signals inputted from the image processor 110, and output corrected data signals. However, this is merely an example, and the color compensation part 100 may be included within the image processor 110. Moreover, one or more of the components of the color compensation part 100 may be included in other devices.

<Third Exemplary Embodiment>

FIG. 14 is a graph illustrating the concept of compensation according to a third exemplary embodiment of the present disclosure.

In FIG. 14, the vertical axis represents data gain, and the horizontal axis represents position on the display area. The display area of a display panel comprises a display area BA of a bending portion and a display area FA of a flat portion. The display area BA of the bending portion and the display area FA of the flat portion are separated by a start point.

In an example, the start point corresponds to the boundary between the display area BA of the bending portion and the display area FA of the flat portion. In another example, the start point corresponds to the point at which the display area on the display panel starts bending. Moreover, the start point may correspond to the point at which data gain starts to vary. Therefore, the start point in FIG. 14 may be construed as having any one or more of three meanings: "start point", "boundary", or "point of variation".

As shown in FIG. 14, in the third exemplary embodiment of the present disclosure, data gain for data signals varies depending on whether the data signals are generated (or compensated) for the display area BA of the bending portion or the display area FA of the flat portion.

As in a first example shown in (a) of FIG. 14, the data gain for the display area BA of the bending portion may vary linearly from threshold gain Under gain TH.

The threshold gain Under gain TH is set with respect to the outermost part of the display area BA of the bending portion. The data gain varies linearly from the outermost part of the display area BA of the bending portion to the start point.

As in a second example shown in (b) of FIG. 14, the data gain for the display area BA of the bending portion may vary nonlinearly (e.g., quadratically) from the threshold gain Under gain TH. The threshold gain Under gain TH is obtained through a test conducted to even out either or both of color deviations and color temperature differences.

The threshold gain Under gain TH is set with respect to the outermost part of the display area BA of the bending portion. The data gain varies quadratically from the outermost part of the display area BA of the bending portion to the start point.

Meanwhile, as can be seen from FIG. 14, the threshold gain Under gain TH is not fixed to a specific value but varies between the highest threshold gain Under gain THU and the lowest threshold gain Under gain THL. As can be seen from the first and second exemplary embodiments, the threshold gain Under gain TH is used as a reference value for evening out either or both of color deviations and color temperature differences.

The display panel has variables depending on the user or usage environment. Based on this, in the third exemplary embodiment, the user may change the threshold gain Under gain TH manually or based on external input information (viewing angle information and panel angle information). That is, in the third exemplary embodiment, the data gain varies from the adaptive threshold gain Under gain TH which is in a range of THU to THL.

Additionally, although the first to third exemplary embodiments of the present disclosure have been described with an example in which the data gain for the display area BA of the bending portion is reduced compared to the display area FA of the flat portion, the present disclosure is not limited to this example.

As discussed above, the present disclosure offers the advantage of improving display quality since color deviation improvement or color temperature compensation can be made automatically in a manner optimized for active bending areas of different sizes. Another advantage of the present disclosure is that deviations can be improved by compensating with linearly or quadratically-varying data gain at the start point (coordinates) of an active bending area. Yet another advantage of the present disclosure is that adaptive color deviation improvement and color temperature compensation can be made based on the viewing angle at which the user is looking at the display panel and the slope of the display panel.

The various embodiments or components thereof described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
a display panel comprising a display area which has a flat portion and a bending portion; and
a color compensation part configured to compensate for input data signals by applying data gains which are set differently for the flat portion or the bending portion,
wherein the data gains for the bending portion change to rise from an outermost part of the bending portion to a boundary between the bending portion and the flat portion,
wherein a first data gain for the outermost part of the bending portion is set to be greater than 0 and less than 1, and is set differently for each color of the input data signals,
wherein a second data gain for the boundary is fixed to 1 regardless of colors of the input data signals,
wherein the first data gain includes an adaptive threshold gain, the adaptive threshold gain varying between a highest threshold gain and a lowest threshold gain, the highest threshold gain having a value greater than the adaptive threshold gain and the lowest threshold gain having a value lower than the adaptive threshold gain,
wherein the adaptive threshold gain is a reference value for evening out at least one of color deviations and color temperature differences between the flat portion and the bending portion,
wherein the adaptive threshold gain varies between the highest threshold gain and the lowest threshold gain based on external input information.

2. The display device of claim 1, wherein the color compensation part is further configured to calculate the data gains differently for the flat portion or the bending portion to eliminate or mitigate color deviations and color temperature differences between the flat portion and the bending portion.

3. The display device of claim 1, wherein the compensation part is further configured to calculate the data gains differently for the input data signals of pixels for different colors.

4. The display device of claim 1, wherein the data gains for the bending portion vary one or more of linearly or nonlinearly from the adaptive threshold gain which is set for the outermost part of the bending portion.

5. The display device of claim 1, wherein the color compensation part is further configured to calculate the data gains based on one or more between the at least one of a viewing angle at which the a user is looking at the display panel and a the slope angle of the display panel.

6. The display device of claim 1, wherein the color compensation part comprises:
a viewing angle calculation part configured to calculate a viewing angle at which a user is looking at the display panel;

a gain curve derivation part configured to derive a gain curve for the bending portion based on the viewing angle;
a gain calculation part configured to calculate data gains for the bending portion based on the gain curve; and
a data correction part configured to correct the input data signals by applying the data gains.

7. The display device of claim 6, wherein the data correction part corrects the input data signals for each pixel or for each pixel block consisting of a plurality of pixels.

8. The display device of claim 1, wherein the color compensation part comprises:
a viewing angle calculation part configured to calculate a viewing angle at which a user is looking at the display panel;
a panel angle calculation part configured to calculate a slope angle of the display panel;
a gain curve derivation part configured to derive a gain curve for the bending portion based on the viewing angle and the slope angle;
a gain calculation part configured to calculate data gains for the bending portion based on the gain curve; and
a data correction part configured to correct the input data signals by applying the data gains.

9. The display device of claim 8, wherein the data correction part corrects the input data signals for each pixel or for each pixel block consisting of a plurality of pixels.

10. The display device of claim 1, further comprising a timing controlling part, wherein the color compensation part is integrated in the timing controlling part.

11. The display device of claim 1, wherein the external input information is based on a viewing angle information including at least one of a viewing angle at which a user is looking at the display panel or a panel angle information including a slope angle of the display panel.

12. A method of driving a display device with a display panel, wherein the display panel comprises a display area which has a flat portion and a bending portion, the method comprising:
calculating data gains differently for the flat portion and the bending portion;
correcting input data signals by applying the calculated data gains; and
displaying the corrected data signals,
wherein the data gains for the bending portion change to rise from an outermost part of the bending portion to a boundary between the bending portion and the flat portion,
wherein a first data gain for the outermost part of the bending portion is set to greater than 0 and less than 1, and is set differently for each color of the input data signals,
wherein a second data gain for the boundary is fixed to 1 regardless of colors of the input data signals,
wherein the first data gain includes an adaptive threshold gain, the adaptive threshold gain varying between a highest threshold gain and a lowest threshold gain, the highest threshold gain having a value greater than the adaptive threshold gain and the lowest threshold gain having a value lower than the adaptive threshold gain,
wherein the adaptive threshold gain is a reference value for evening out at least one of color deviations and color temperature differences between the flat portion and the bending portion,
wherein the adaptive threshold gain varies between the highest threshold gain and the lowest threshold gain based on external input information.

13. The method of claim 12, further comprising:
calculating the data gains differently for the input data signals of pixels for different colors.

14. The method of claim 12, wherein the data gains for the bending portion vary linearly or nonlinearly from the adaptive threshold gain which is set for the outermost part of the bending portion.

15. The method of claim 14, further comprising:
setting the adaptive threshold gain based on at least one of a viewing angle at which a user is looking at the display panel or a slope angle of the display panel.

16. The method of claim 12, wherein the step of calculating data gains comprising:
calculating at least one of a viewing angle at which a user is looking at the display panel or a slope angle of the display panel;
deriving a gain curve for the bending portion based on the at least one of the viewing angle or the slope angle; and
calculating the data gains for the bending portion based on the gain curve.

17. The method of claim 12, wherein the input data signals are corrected for each pixel or for each pixel block consisting of a plurality of pixels.

* * * * *